(12) United States Patent
Fabbro et al.

(10) Patent No.: US 11,811,396 B2
(45) Date of Patent: Nov. 7, 2023

(54) POWER TRANSFER, GATE DRIVE, AND/OR PROTECTION FUNCTIONS ACROSS AN ISOLATION BARRIER

(71) Applicant: Infineon Technologies Austria AG, Villach (AT)

(72) Inventors: Simone Fabbro, Udine (IT); Paulus Petrus Bernardus Arts, Villach (AT); Davide Giacomini, Valdenge (IT)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 0 days.

(21) Appl. No.: 17/491,235

(22) Filed: Sep. 30, 2021

(65) Prior Publication Data
US 2023/0101061 A1 Mar. 30, 2023

(51) Int. Cl.
| | |
|---|---|
| *H03K 17/689* | (2006.01) |
| *H02H 7/10* | (2006.01) |
| *H03K 17/691* | (2006.01) |
| *H02H 1/00* | (2006.01) |
| *H02H 7/20* | (2006.01) |

(52) U.S. Cl.
CPC .......... *H03K 17/689* (2013.01); *H02H 7/10* (2013.01); *H03K 17/691* (2013.01); *H02H 1/0007* (2013.01); *H02H 7/20* (2013.01); *H03K 2217/0081* (2013.01)

(58) Field of Classification Search
CPC .. H03K 17/689; H03K 17/691; H03K 17/693; H03K 17/722; H03K 17/723; H03K 17/725; H03K 17/73; H03K 17/735; H03K 17/76; H03K 17/785; H03K 17/81; H02H 7/10; H02H 7/20; H02H 7/106; H02H 7/1209; H02H 7/1213; H02H 7/122; H02H 7/1225; H02H 7/1227; H02H 7/205; H02H 7/26
See application file for complete search history.

(56) References Cited

U.S. PATENT DOCUMENTS

| | | | |
|---|---|---|---|
| 5,900,683 A | 5/1999 | Rinehart et al. | |
| 6,107,860 A * | 8/2000 | Vinciarelli | H03K 17/691 |
| | | | 327/434 |
| 2015/0318685 A1* | 11/2015 | Hsieh | H02H 7/1252 |
| | | | 363/53 |
| 2020/0136602 A1* | 4/2020 | Shousha | H03K 17/691 |
| 2021/0328519 A1 | 10/2021 | Fabbro | |

OTHER PUBLICATIONS

Extended European Search Report; dated Feb. 9, 2023; 7 Pgs.

* cited by examiner

*Primary Examiner* — Nguyen Tran
(74) *Attorney, Agent, or Firm* — COOPER LEGAL GROUP, LLC

(57) ABSTRACT

An apparatus comprises an energy transfer device configured to supply power from a primary side of an isolation barrier through the isolation barrier to a secondary side of the of the isolation barrier for driving a gate of a switch for controlling output of the switch at the secondary side. The apparatus comprises a monitoring component. The monitoring component is configured to monitor an operating state of the switch. The monitoring component is configured to evaluate the operating state to determine whether a fault has occurred, perform a countermeasure, and/or provide a signal of the fault.

20 Claims, 12 Drawing Sheets

POWER TRANSFER, GATE DRIVE, AND/OR PROTECTION FUNCTIONS ACROSS AN ISOLATION BARRIER

TECHNICAL FIELD

The present disclosure relates to the field of providing power transfer, gate drive, and/or protection functions across isolation barriers.

BACKGROUND

Various types of devices may utilize switches, such as solid state switches. A switch may be controlled from a power domain of the device. The power domain may be isolated with respect to a region of the device at which the switch is located. Isolation may be achieved by using an optical isolation barrier. The optical isolation barrier is positioned within the device between a first side of the device comprising the power domain and a second side of the device comprising the switch. In order to control the switch through the optical isolation barrier, information and/or energy has to be sent across the optical isolation barrier. Unfortunately, optically isolated switches may lead to and imply high manufacturing costs and may enable only limited gate drive capability with regard to achievable drive voltage and current.

Many existing solutions, such as alternatives to optical isolation using galvanic isolation based on capacitive coupling or transformer coupling that both require integration capabilities, have various drawbacks. One such drawback is the requirement of additional specific supply pins at one or more sides of an isolation barrier. Another drawback is the inability to integrate an isolation barrier and a solid state switch into a same package. Yet another drawback is the inability to provide pin to pin compatibility with other isolation devices meant for driving solid state switch, such as optocouplers or solid state relays, which typically do not require any specific power supply pin at the isolation side where the drive switch is located. Furthermore, existing isolation solutions are not always able to generate voltages on a secondary side of the isolation barrier (e.g., the second side at which the switch is located) that are higher than voltages at a primary side of the isolation barrier (e.g., the first side where the power domain is located). This greatly constrains and limits the types of switches that can be utilized because such switches would have to have a threshold voltage compatible with an input voltage range, which may be prohibitively low in relation to voltages used to operate the switches. One drawback for capacitive isolation is common mode transient immunity between the two sides of an isolation barrier, which can quickly move their potential in opposite directions. Although some products may combine one or more of these isolation solutions and/or features thereof, there is no current product that addresses all of the aforementioned deficiencies at the same time while providing integrated protection features, safety countermeasures, and/or fault communication.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises an energy transfer device configured to supply power from a primary side of an isolation barrier through the isolation barrier to a secondary side of the of the isolation barrier to directly drive a gate of a switch for controlling output of the switch at the secondary side. The apparatus comprises a monitoring component. The monitoring component is configured to monitor an operating state of the switch, and evaluate the operating state to determine whether a fault has occurred.

In an embodiment of the techniques presented herein, an apparatus is provided. The apparatus comprises an energy transfer device configured to supply power from a primary side of an isolation barrier through the isolation barrier to a secondary side of the of the isolation barrier to power an isolated gate driver to drive a gate of a switch for controlling output of the switch at the secondary side. The apparatus comprises a monitoring component. The monitoring component is configured to monitor an operating state of the switch, and evaluate the operating state to determine whether a fault has occurred.

In an embodiment of the techniques presented herein, a method is provided. The method includes controlling a monitoring component of an isolated power converter to determine an operating state of a switching component associated with a secondary side of an apparatus. The switching component is driven based upon power transferred from a primary side of the apparatus through an isolation barrier to the secondary side. The operating state is evaluated to determine whether the switching component has experienced a fault. In response to the switching component experiencing the fault, a countermeasure is implemented.

In an embodiment of the techniques presented herein, an apparatus is provided. The apparatus includes a means for controlling a monitoring component of an isolated power converter to determine an operating state of a switching component associated with a secondary side of an apparatus. The switching component is driven based upon power transferred from a primary side of the apparatus through an isolation barrier to the secondary side. The apparatus comprises a means for evaluating the operating state to determine whether the switching component has experienced a fault. The apparatus comprises a means for implementing a countermeasure in response to the switching component experiencing the fault.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
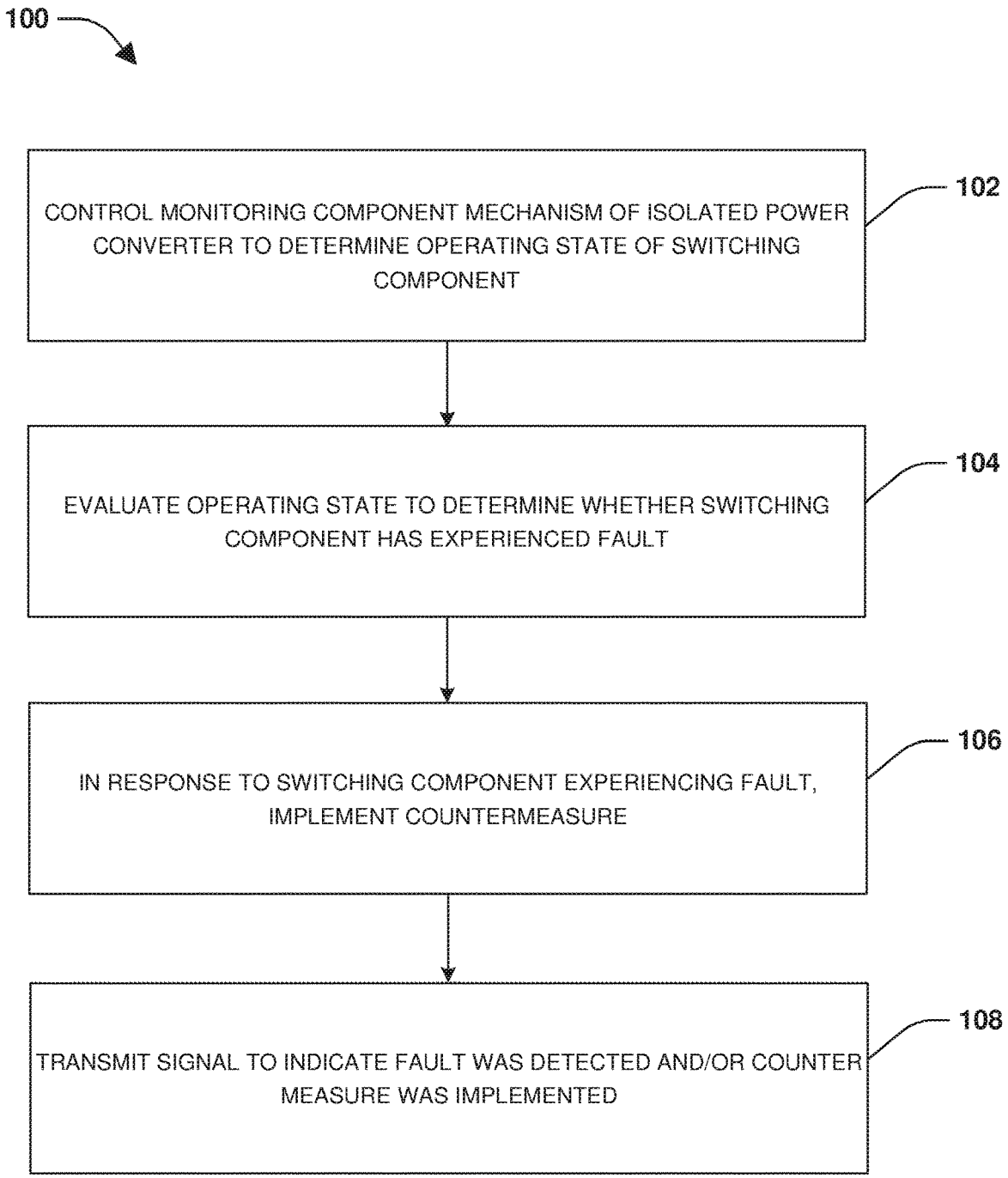
FIG. 1 is an illustration of an example method of providing power transfer, gate drive, and/or protection functions across an isolation barrier in accordance with the techniques presented herein.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, a device comprises a switch that is to be controlled from a region of the device, such as a power domain region of the device, which is to be isolated from the switch. The ability to operate the switch is improved by using electrical isolation, such as by utilizing a capacitive coupling, a transformer such as a core or coreless transformer or any other type of transformer, or other electrical isolation barrier. The electrical isolation barrier can be used in a manner that does not introduce topological differences or penalties in the device, and thus the device can be easily swapped with other existing devices without introducing noticeable differences, such as in device size, package, or pinout. For example, pin to pin compatibility is provided because there is no need for additional pins otherwise used to provide a specific power supply on either side of the electrical insolation barrier.

An energy transfer device is capable of transmitting an adequate amount of energy from a first side of the device (e.g., a side within which the power domain region is located), through the electrical isolation barrier, to a second side of the device within which the switch is located. The energy is transferred to the secondary side of the isolation barrier element during a sequence of switching cycles applied to the primary side of the isolation barrier element, so that the switch, such as a solid state switch, can be properly and reliably turned on with sufficient speed and without the need of additional energy from the secondary side. Furthermore, power to the switch is safely turned off with sufficient speed without having to transfer energy across the electrical isolation barrier and without the need of external components.

The techniques and apparatuses provided herein are capable of providing power transfer, gate drive, and/or monitoring solutions. In some embodiments, these capabilities may be part of a single chip solution. Power transfer is provided utilizing isolated power converters that can power a switch across an isolation barrier. Direct and/or indirect gate drive is provided utilizing isolated gate drivers or solid state relays with or without the integration of protection functions, independent safety countermeasures, and/or fault communication to a primary side of a device. Isolated monitoring solutions are provided utilizing isolation amplifiers or comparators, isolated analog to digital converters, non-isolated amplifiers, and/or analog to digital converters located on a secondary side and coupled to analog or digital isolators.

In some embodiments, a direct gate drive feature is provided. This direct gate drive feature relates to the integration of secondary power supply generation with voltage levels higher than those at a primary side together with a gate drive function. The gate drive function may be provided for solid state relay applications that relate particularly to applications where switching speeds and turn ON times of the driven switches are not particularly fast, such as switching frequencies less than 1 kHz. Hence, in these applications, the power conversion function and the generation of the secondary side supply can coincide with that of the gate drive of the switch. The gate of the switch is directly controlled by the output of a power converter. In this way, if the power conversion is started from the primary side, this translates directly to the gate drive at the secondary side without using a specific gate driver in-between. When the power converter is restarted from the power converter's turn off condition, the power converter's own start up time is reflected directly on the turn ON time of the switch, and thus this direct gate drive feature may be suitable for relatively slower switching. Because the switching speed may not be a key focus of solid state relay applications, the power transfer strength may not necessarily be a key parameter where the higher the transferred power, the faster the turn ON of the controlled switch. Hence, for solid state relays, a wide variety of isolated power converters can be considered, possibly preferring some due to chip integration advantages (complexity and size) rather than power transfer capability or efficiency. In this way, the direct gate drive feature powers a switch with an output voltage of a power converter.

In some embodiments, an indirect gate drive feature is provided. This indirect gate drive feature enhances the gate drive function for allowing faster switching speeds and higher frequencies such as frequencies greater than 1 kHz. This is achieved by decoupling the isolated power conversion (and secondary supply generation) function from that of the isolated gate drive. This decoupling is accomplished by combining a transformer based isolated power converter and an isolated gate driver on a same chip (either monolithically or in a System in Package (SiP)). This transformer based isolated power converter offers voltage conversion ratios larger than 1 so that switches can be driven at the secondary side, where a drive voltage of a switch is higher than a voltage class of the controller which controls the switching at the primary side. Voltage conversion ratios larger than 1 are possible utilizing various isolated power conversion topologies, such as a flyback converter and/or resonant converters of different kinds where the secondary/primary transformer winding ratio is larger than 1. While the secondary power supply may be constantly available and once the power converter is started and operated independently of the isolated gate driver, the isolated gate driver coupled to the controller at the primary side can operate independently and control a gate of the connected switch with higher switching frequency and speed. With switching speed as a focus, power transfer strength and efficiency are relevant parameters. Hence, transformer based integrated isolated power converters may be a suitable choice. In this way, the indirect gate drive feature relates to a combination of an integrated transformer based isolated converter with voltage conversion ratios larger than 1 and an isolated gate driver.

With the integrated isolated power converter operating on its own, independent on whether the integrated isolated power converter is coupled with or decoupled from the switch gate drive, it is possible to start the power conversion once and to keep it active for generating the secondary supply throughout system operation.

In some embodiments, a safety monitoring and/or related countermeasures feature is provided. The secondary power supply generated by the integrated isolated power converter can also be used to supply other functions, which can monitor the safety status at the secondary side, for example. These other functions can be implemented independent of whether an integrated isolated gate driver is added for faster switching, a gate of a switch is directly coupled to the secondary power supply, and/or if a switch is not connected/controlled at all. The safety functions may be, for example, monitoring to determine whether a critical temperature threshold, a current threshold, and/or a voltage threshold has been reached either at a switch driven by either the isolated power converter or by an isolated gate driver combined with the isolated power converter, or at any other component located at the secondary side.

In the event that the monitoring functions detect a fault, countermeasures can be promptly determined and applied directly at the secondary side without waiting for any reporting delay to the controller at the primary side and delay waiting on a decision from the controller at the primary side. For example, where a switch is being driven either directly by the isolated power converter or by the isolated gate driver, detecting a fault condition can imply that this switch is turned off. In this way, this safety monitoring and/or related countermeasures feature provides for the integration of safety monitoring functions and possibly related countermeasures together with an isolated power converter for their supply. In some embodiments, this safety monitoring and/or related countermeasures feature may be separately implemented (e.g., implemented without the integration of other features) with its independent secondary power supply, thus allowing safety monitoring of otherwise supplied secondary power domains even before the secondary power domains are energized.

In some embodiments, a reporting feature is provided. The reporting feature is implemented to report information to the controller operating on the primary side in order to inform the controller of any known critical conditions that were met at the secondary side and/or whether any countermeasures were applied. For example, the reporting feature may be implemented to flag a fault, detected at the secondary side, to the primary side and/or whether any countermeasures were implemented for the fault. In some embodiments, a fault may be reported by changing a current or a voltage at an output pin. In some embodiments of flagging the fault, a pin at the inside side may change a logical state based upon detection of the fault or in reaction to the fault. In some embodiments, an additional isolation barrier may be utilized as part of the reporting features. In this way, this reporting feature relates to the integration of communication of detected faults and/or implemented countermeasures from the secondary side to the primary side.

In some embodiments, an integrated power driven switch feature is provided. The integrated power driven switch feature relates to integrating a switch that is to be driven with an arrangement used to generate a secondary power supply used to control a gate of the switch.

Various advantages are achieved by combining/integrating one or more of these features together, such as integrating the integrated power driven switch feature, the reporting feature, and/or the safety monitoring and/or related countermeasures feature into an arrangement having either the direct gate drive feature or the indirect gate drive feature. The combination/integration of one or more of these features provides advantages related to reduction of materials (BOM), system size, cost, complexity, and/or overall system safety in terms of fault response.

Figure 2:
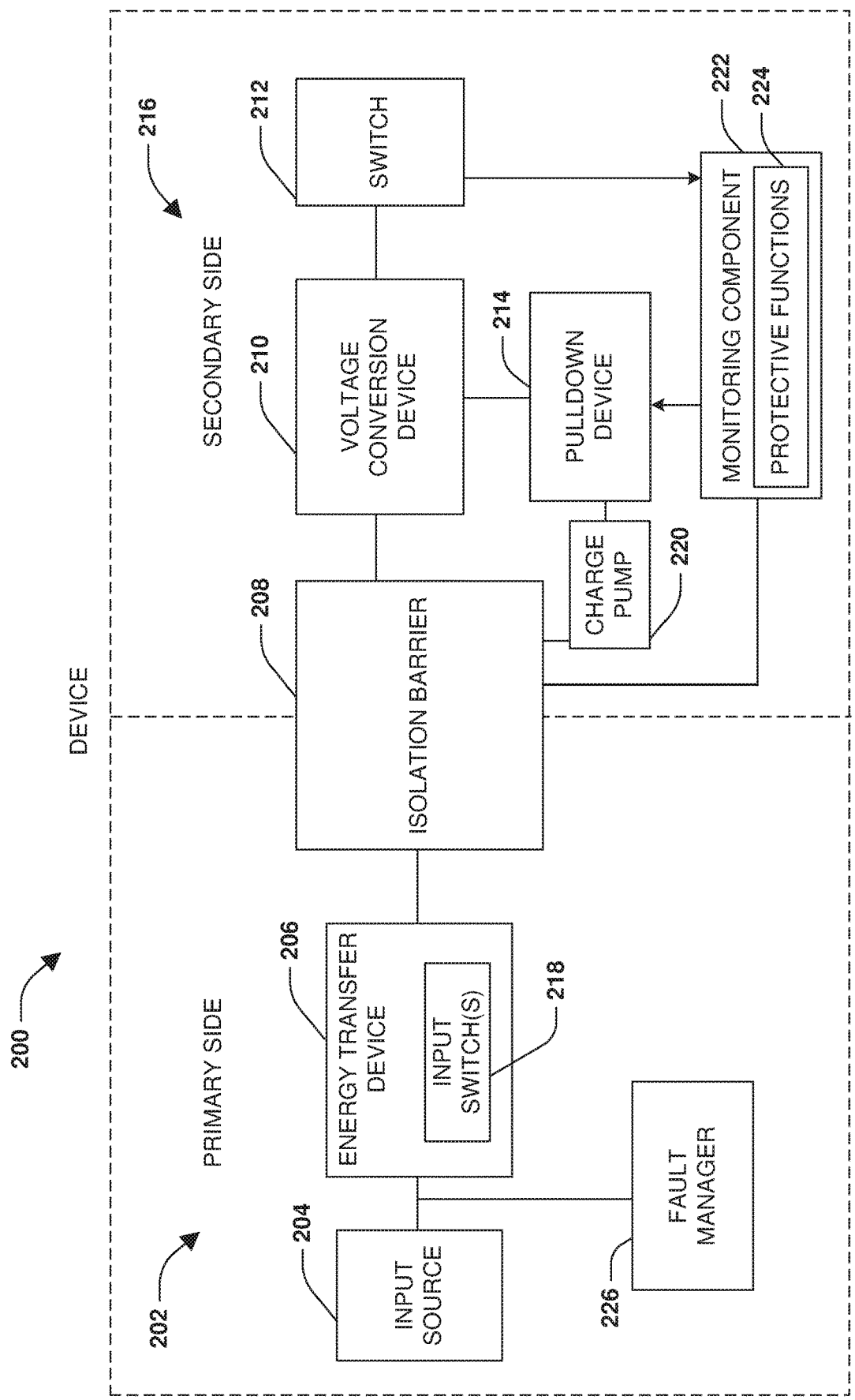
FIG. 2 is a component block diagram illustrating an apparatus for providing power transfer, gate drive, and/or protection functions across an isolation barrier in accordance with the techniques presented herein.

An embodiment of providing power transfer, gate drive, protection functions, and/or fault communication to a primary side across an isolation barrier is illustrated by an exemplary method 100 of FIG. 1 and further described in conjunction with FIG. 2. An apparatus, such as device 200 of FIG. 2, comprises an isolation barrier 208 that isolates a primary side 202 of the device 200 from a secondary side 216 of the device 200. In some embodiments, the device 200 may correspond to an isolated power converter. The isolation barrier 208 may comprise an electrical isolation device that provides electrical isolation between the primary side 202 and the secondary side 216 of the device 200. In an embodiment, the isolation barrier 208 comprises a transformer, such as a coreless transformer or a core transformer (e.g., transformer 316 of FIG. 3). In an embodiment, the isolation barrier 208 comprises a capacitive coupling. The isolation barrier 208 provides galvanic isolation between the primary side 202 and the secondary side 216.

The primary side 202 comprises an input source 204. The input source 204 may be associated with an input power domain that supplies an input voltage for the primary side 202. The primary side 202 may comprise one or more input switches 218 (e.g., a first input switch SW1A 308, a second input switch SW1B 310, a third input switch SW2A 312, and a fourth input switch SW2B 314 of FIG. 3). The primary side 202 comprises an energy transfer device 206 configured to operate the one or more input switches 218 to perform a plurality of switching cycles for transferring energy through the isolation barrier 208 to the secondary side 216 for controlling a switch 212 located at the secondary side 216 of the device 200. The plurality of switching cycles correspond to a sequence of switch cycles where energy transfer is either active or inactive. The energy transfer device 206 may operate the one or more input switches 218 according to a frequency (e.g., a switching frequency) and a duty cycle to transfer the energy through the isolation barrier 208 during a switching cycle for activating the switch 212. In an embodiment, an On-Off Keying technique is utilized by the energy transfer device 206 to perform a plurality of switching cycles for transferring the energy through the isolation barrier 208 for operating the switch 212.

Accordingly, the one or more input switches 218 are operated according to the frequency and the duty cycle to transfer the energy through the isolation barrier 208 during a sequence of switching cycles for activating the switch 212. In an embodiment, the On-Off Keying is applied by operating the one or more input switches 218 according to a determined frequency and duty cycle. The frequency may be set to a high enough value in order to limit a current flow through a primary winding of the isolation barrier 208 (e.g., a transformer) within a switching cycle. Depending on whether a flyback converter or a voltage multiplier is utilized as a voltage conversion device 210 at the secondary side 216, different duty cycles may be utilized. For example, the duty cycle may be set to 50% for the voltage multiplier where energy is driven by the energy transfer device 206 according to a push and pull manner. In this example, the switching cycle comprises a first phase where input current flows from a top terminal of the isolation barrier 208 to a bottom terminal of the isolation barrier 208. The switching cycle comprises a second phase where input current flows from the bottom terminal to the top terminal. For the flyback converter, the duty cycle may be set based upon the switching frequency so that an inductance across the isolation barrier 208 does not reach a saturation point or reliability issues do not occur.

If the one or more input switches 218 are kept off by the energy transfer device 206, then no energy transfer takes place. If the one or more input switches 218 are turned on by the energy transfer device 206, then energy is transferred through the isolation barrier 208 to the secondary side 216 for turning on the switch 212. In this way, a sequence of switching cycles are performed where energy transfer is either active or inactive.

In some embodiments, the device 200 comprises the voltage conversion device 210 located at the secondary side 216 of the device 200. The voltage conversion device 210 may comprise a flyback converter, a voltage multiplier such as a Cockroft-Walton voltage multiplier, or other voltage conversion device. The voltage conversion device 210 may be configured to convert the energy transferred by the energy transfer device 206 from the input voltage associated with the input source 204 to an output voltage capable of controlling, such as turning on, the switch 212. In an embodiment, the voltage conversion device 210 may convert the input voltage to a relatively higher voltage as the output voltage capable of turning on the switch 212 (e.g., turning on a gate of a solid state switch). In this way, various types of switches 212 can be used that could otherwise not be operable/compatible with the relatively lower input voltage associated with the input source 204. The voltage conversion device 210 outputs the output voltage when the energy transfer by the energy transfer device 206 is active. In this way, energy is converted from the input voltage of the primary side 202 to the output voltage to control the switch 212 when the energy transfer is active.

The device 200 comprises a pulldown device 214, such as a passive turn off device, at the secondary side 216 of the device 200. In an embodiment, the pulldown device 214 comprises a depletion MOSFET (e.g., a depletion n channel MOSFET or a depletion p channel MOSFET). When no energy transfer is being performed by the energy transfer device 206 to otherwise activate the switch 212, the pulldown device 214 passively (e.g., without the need for power to be supplied to the pulldown device 214) deactivates the switch 212 to turn off the switch 212. For example, when there is no energy transfer, capacitors on the secondary side 216 are discharged, and thus a source and a gate of the pulldown device 214 are at a same/similar potential, which, in a depletion MOSFET, creates a conduction channel between the source and the drain of the pulldown device 214, in some embodiments. In some embodiments, the pulldown device 214 may be a depletion MOSFET, a p-MOSFET or other device. The conduction channel acts like a resistor, sized according to dimensions of the pulldown device 214, which applies a turn off strength between a gate and a source of the switch 212 to turn off the switch 212 (e.g., by shorting the gate of the switch 212 to the source of the switch 212). In this way, the pulldown device 214 passively deactivates the switch 212, without being actively driven with power, when no energy transfer is being performed.

The pulldown device 214 may be disabled from passively deactivating the switch 212 when the energy transfer is active. In an embodiment, a charge pump 220 (e.g., a positive charge pump for the depletion p channel MOSFET or a negative charge pump for the depletion n channel MOSFET) may be utilized to disable the pulldown device 214 from passively deactivating the switch 212 when the energy transfer is active. With the depletion n channel MOSFET, the negative charge pump is utilized to actively drive down a gate of the depletion n channel MOSFET using a negative voltage to disable the depletion n channel MOSFET from passively deactivating the switch 212 when the energy transfer is active. In this way, the pulldown device 214 is disabled from passively deactivating the switch 212 when the energy transfer is active. When the energy transfer is inactive, a load at an output of the negative charge pump discharges the negative voltage to enable the depletion n channel MOSFET to passively deactivate the switch 212. When there is no switching activity, the negative charge pump is inactive. In this way, the pulldown device 214 is enabled to passively deactivate the switch 212 when the energy transfer is inactive.

In some embodiments, the energy transfer device 206 is configured according to a direct gate drive feature to power the switch 212 using an output voltage from the voltage conversion device 210. That is, the energy transfer device 206 is configured to supply power from the primary side 202 of the isolation barrier 208, through the isolation barrier 208, to a secondary side of the isolation barrier 208 to directly drive a gate of the switch 212 for controlling output of the switch 212 at the secondary side 216. In some embodiments, energy transfer device 206 is configured according to an indirect gate drive feature to supply power through the isolation barrier 208 to power an isolated gate driver that drives the gate of the switch 212 for controlling the output of the switch 212 at the secondary side 216. An isolated power converter (e.g., a flyback converter, a resonant converter, etc.) may be configured to provide a voltage conversion ratio larger than 1 for driving the gate of the switch 212.

In some embodiments, the switch 212 may be internal with respect to the device 200, as illustrated by FIG. 2, while in other embodiments, the switch 212 may be external to the device 200. In some embodiments, the switch 212 and the device 200 may be arranged in a multi-die package.

In some embodiments, a monitoring component 222 may be configured to provide integration of a safety monitoring and/or related countermeasures feature for the device 200. In some embodiments, the monitoring component 222 may be integrated into the secondary side 216 of the device 200. In some embodiments where the isolation barrier 208 is a transformer, the monitoring component 222 may be powered from energy from a secondary winding of the transformer. The monitoring component 222 may implement protective functions in order to provide the safety monitoring and/or related countermeasures feature for the device 200. In an example, the monitoring component 222 may implement the protective functions to monitor an operating state of the switch 212 or other component, such as by measuring current, temperature, voltage, and/or other operational information of the switch 212 or other component. In this way, the monitoring component 222 of the isolated power converter is controlled to determine the operating state of the switch 212 (e.g., a switching component associated with the secondary side 216 of the device 200), during operation 102 of method 100.

During operation 104 of method 100, the monitoring component 222 is controlled to evaluate the operating state to determine whether a fault has occurred. For example, the monitoring component 222 may implement the protective functions 224 to compare a measured current, a measured temperature, a measured voltage, or other information of the operating state against one or more thresholds to determine whether the one or more thresholds have been exceeded. In response to the monitoring component 222 determining that the switch 212 or other component has experienced a fault, a countermeasure may be implemented using the protective functions 224 of the monitoring component 222, during operation 106 of method 100. In an example of implementing the countermeasure, the monitoring component 222 may utilize the protective functions 224 to turn off the switch 212. For example, the pulldown device 214 at the secondary side 216 may be used to turn off the switch 212.

In some embodiments, the monitoring component 222 is configured to provide integration of a reporting feature for the device 200. In an example, the monitoring component 222 may transmit a signal to the primary side 202, such as to a fault manager 226, to indicate that the fault of the switch 212 was detected. In an example, the monitoring component 222 may transmit a signal to the primary side 202, such as to the fault manager 226, to indicate that the countermeasure was implemented. In this way, the monitoring component 222 transmits a signal to indicate that the fault was detected and/or that the countermeasure was implemented, during operation 108 of method 100. The monitoring component 222 may transmit the signal to indicate the operating state detected by the monitoring component 222, which may be indicative of other information than a detected fault or countermeasure performed. In some embodiments, the signal is transmitted through the isolation barrier 208 such as by shorting a secondary winding of the isolation barrier 208. This is detected at the primary side 202 as an increase in current consumption. The signal may also be transmitted through a different isolation barrier supporting communication from the secondary side 216 to the primary side 202, through the use of a buffer capacitor used as an energy reservoir during the secondary to primary side fault information transmission, to compensate for the possibly limited power availability at the secondary side, etc. In some embodiments, the fault manager 226 may be configured to suspend the supply of power to the secondary side 216 for a time duration, provided that this interruption in the power transfer does not impair the functionalities at the secondary side, so that the signal can be received during the time duration through the isolation barrier 208 from the monitoring component 222. In some embodiments, the fault manager 226 is located at the primary side 202, and is configured to implement an action in response to receiving the signal from the monitoring component 222 that the fault was detected. In some embodiments, the fault manager 226 may be configured to translate the fault communication into a signal, which µC on the primary side can acquire (e.g. a logic signal).

Figure 3:
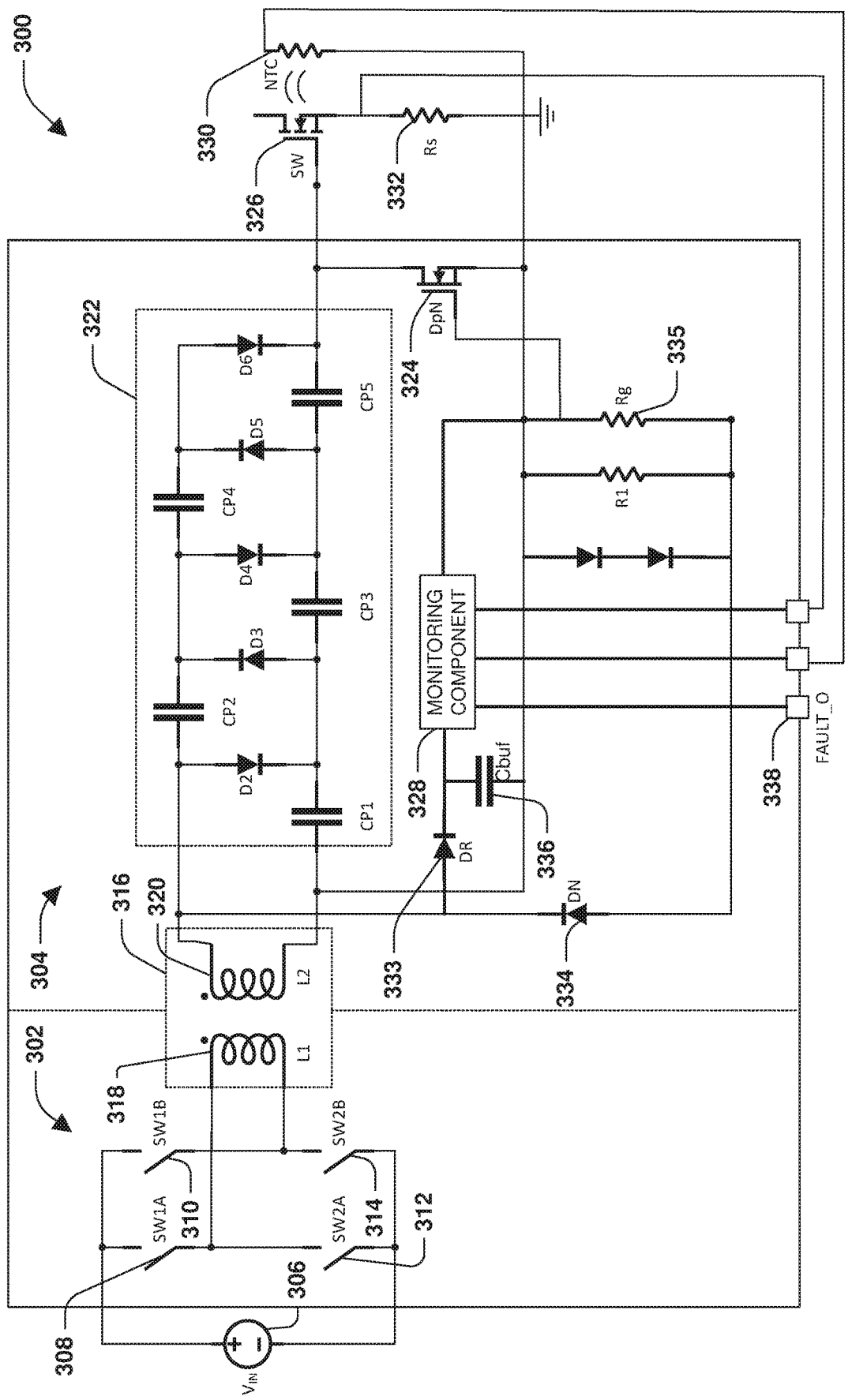
FIG. 3 is a component block diagram illustrating an apparatus for providing power transfer, direct gate drive, and/or protection functions implemented by a monitoring component across an isolation barrier in accordance with the techniques presented herein.

FIG. 3 illustrates an embodiment of an apparatus 300 for providing power transfer, direct gate drive, protection functions, and/or fault communication to a primary side across an isolation barrier. The apparatus 300 comprises a transformer 316 that operates as the isolation barrier to isolate, such as electrically isolate, a primary side 302 of the apparatus 300 from a secondary side 304 of the apparatus 300. The transformer 316 comprises a primary side 318 connected to the primary side 302 of the apparatus 300 and a secondary side 320 connected to the secondary side 304 of the apparatus 300. The transformer 316 provides for electrical isolation between the primary side 302 and the secondary side 304 of the apparatus 300.

The apparatus 300 utilizes a voltage multiplier 322 (e.g., a Cockroft-Walton multiplier) as a voltage conversion device to convert energy from an input voltage of the primary side 302 (e.g., energy transmitted from supply 306 through an isolation barrier to the secondary side 304) to an output voltage to control a switch 326. The voltage multiplier 322 comprises one or more stages. Each stage comprises a diode and a capacitor/capacitance (e.g., capacitor CP1 and diode D2 as a first stage, capacitor CP2 and diode D3 as a second stage, capacitor CP3 and diode D4 as a third stage, etc.). The voltage multiplier 322 converts the input voltage to the output voltage, which may be a higher voltage than the input voltage in order to turn on the switch 326.

The apparatus 300 may comprise one or more input switches located at the primary side 302, such as the first input switch SW1A 308, the second input switch SW1 B 310, the third input switch SW2A 312, and the fourth input switch SW2B 314, that are controlled by On-Off Keying to perform a sequence of switching cycles to transfer energy from the primary side 302 to the secondary side 304 for controlling, such as turning on, the switch 326 at the secondary side 304.

The one or more input switches are operated in a manner to drive the primary side 302 of the isolation barrier (e.g., the primary side 318 of the transformer 316) in a push and pull manner. During a first phase of a switching cycle, an input current flows from a top terminal of the isolation barrier (e.g., a connection on the primary side 302 to a top terminal of the primary side 318 of the transformer 316) to a bottom terminal of the isolation barrier (e.g., a connection on the primary side 302 to a bottom terminal of the primary side 318 of the transformer 316). In particular, the top terminal is pulled up and the bottom terminal is pulled down. Capacitor CP1, capacitor CP3, and capacitor CP5 are charged through diode D2, diode D4, and diode D6, while diode D3 and diode D5 are reverse biased. During a second phase of the switching cycle, the current flows from the bottom terminal to the top terminal of the isolation barrier. In particular, the top terminal is pulled down and the bottom terminal is pulled up. Capacitor CP2 and capacitor CP4 are charged through diode D3 and diode D5, while diode D2, diode D4, and diode D6 are reverse biased. A duty cycle of 50% may be set for symmetry. A switching frequency may be set during each phase to a frequency value that does not cause the insolation barrier to reach/exceed saturation and/or cause reliability issues.

A passive turn off device 324 (e.g., depletion NMOS DpN), a diode DR 333 associated with a voltage rectifier, a buffer capacitor 336, a monitoring component 328, functionality for activating the passive turn off device 324 and deactivating the switch 326 in the event a particular condition is detected (e.g., a current, voltage, or temperature exceeding a threshold), and a signal output 338 for communicating to e.g. an outside controller are integrated into the secondary side 304 of the apparatus 300 as a solid state relay application. The monitoring component 328 may correspond to sensors used to monitor internal parameters or monitor system and application parameters of external components such as current flowing in the switch 326 (e.g., measured by external monitoring component Rs 332) or temperature of the switch 326 (e.g., measured by external monitoring component NTC 330) that is external to the apparatus 300. In this embodiment, the switch 326, the external monitoring component Rs 332, and the external monitoring component NTC 330 are external to the apparatus 300, while other parameters may be internally monitored by the monitoring component 328. In other embodiments, the switch 326 and/or monitoring components may be integrated into the apparatus 300. In some embodiments, the signal output 338 for fault signaling may be located at the secondary side 304. The passive turn off device 324 may be used to perform a countermeasure such as to turn off the switch 326.

In some embodiments, part of the power transferred to the secondary winding of the transformer 316 (or to the secondary side of another isolation barrier such as a capacitive barrier) is used to supply some monitoring components or sensors, such as monitoring component 328, through a dedicated rectifier (Diode DR 333, buffer capacitor CBUF 336). The power delivered to a monitoring component may not suffer from a power bottleneck of a voltage multiplier, making the power consumption constraints of the monitoring components less demanding. The monitoring component 328 may include references, amplifiers, filters, comparators and other circuits to condition sensed internal or external signals and to compare them with thresholds to decide whether conditions of operating states are critical for the switch 326. If a condition is critical, then a decision can be made for deactivating the switch 326 by activating a turn-off device, such as the passive turn off device 324 (e.g., depletion NMOS DpN) or another similar device that implements the same functionality (e.g., an active device in parallel with a passive device), for example. This can be achieved by sending a suitable current through RG 335 so that the gate of passive turn off device 324 can be brought above a threshold voltage. If that injected current is absent, the gate of passive turn off device 324 is pulled down through DN 334. Upon applying this countermeasure to the switch 326, a signal may be transmitted to the signal output 338. In some embodiments, the voltage multiplier may be exchanged with another power converter type to achieve higher power transfers. In this case, the power supply to the monitoring components (sensors) may be derived from the output of that power converter.

Figure 4:
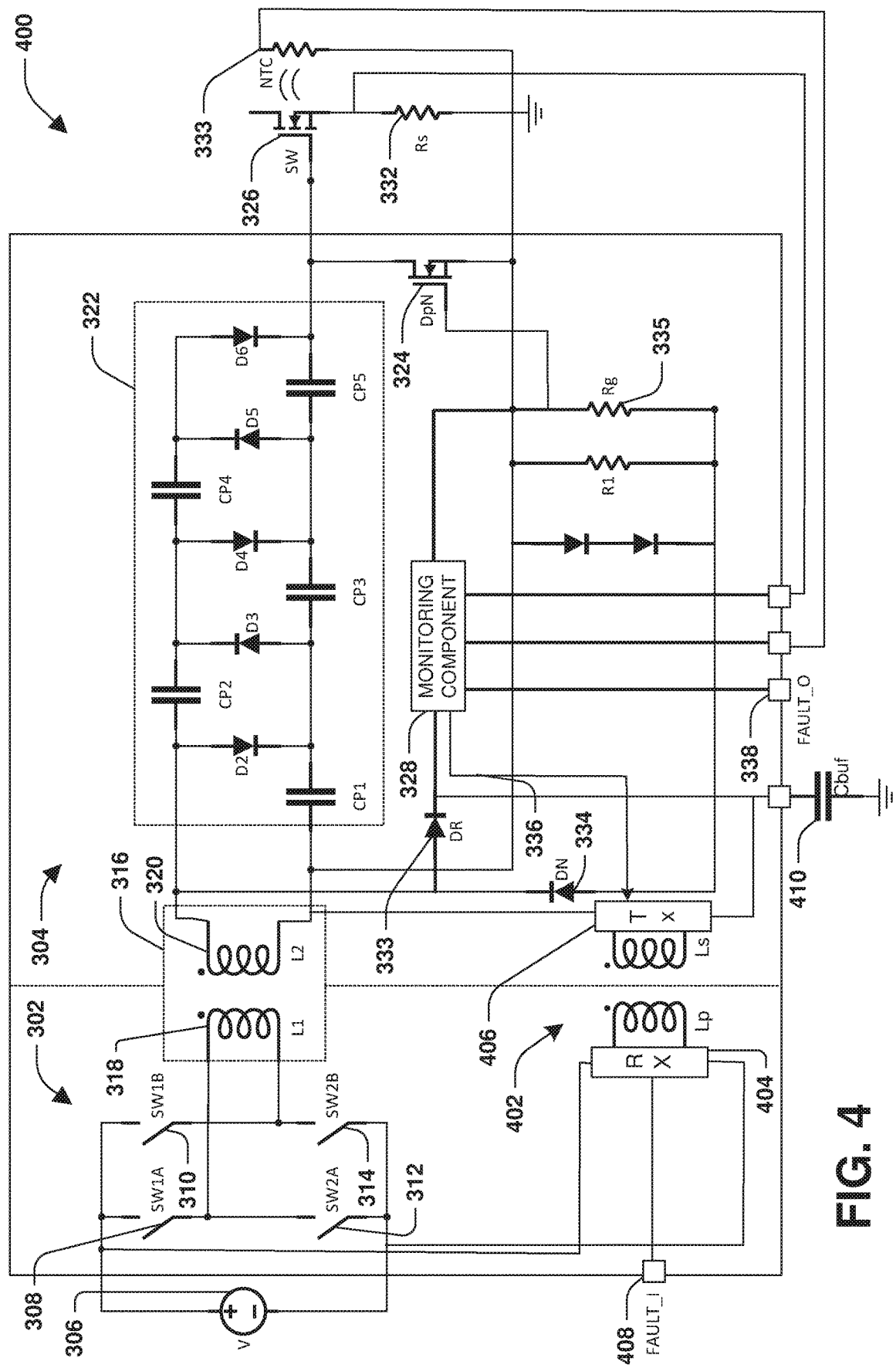
FIG. 4 is a component block diagram illustrating an apparatus for providing power transfer, direct gate drive, protection functions, and/or fault communication to a primary side across an isolation barrier in accordance with the techniques presented herein.

FIG. 4 illustrates an embodiment of an apparatus 400 for providing power transfer, direct gate drive, protection functions, and/or fault communication to a primary side across an isolation barrier. Apparatus 400 is similar to the apparatus 300 of FIG. 3, along with the addition of a reporting feature for fault communication to the primary side 302. This may be achieved by adding a second transformer 402, a related transmitter 406, and a related receiver 404 for signal transfer. The transmitter 406 may drive a secondary side of the second transformer 402 with sufficiently high frequency pulses (e.g., a carrier or a modulated carrier) to indicate that a fault is detected. The transmitted pulses, carrier or modulated carrier, may be detected by the receiver 404 at the primary side 302 so that the fault condition at the secondary side 304 is signaled through a fault output pin 408 on the primary side 302. Pulse polarity or carrier modulation index may be varied to encode different fault events detected (e.g., temperature exceeding a threshold, current exceeding a threshold, voltage exceeding a threshold, etc.). In order to sustain the current consumption of the fault transmission from the secondary side 304, an external buffer capacitor CBUF 410 may be utilized (e.g., a possible internal buffering capacitor after diode DR 333 may also be used, but is not illustrated in this embodiment). This buffer capacitor CBUF 410 is charged up to a sufficient voltage level during normal operation, while no fault is present or before activating the integrated safety monitoring sensors (e.g., sensors used by the monitoring component 328) at the secondary side 304, before a fault transmission takes place.

Figure 5:
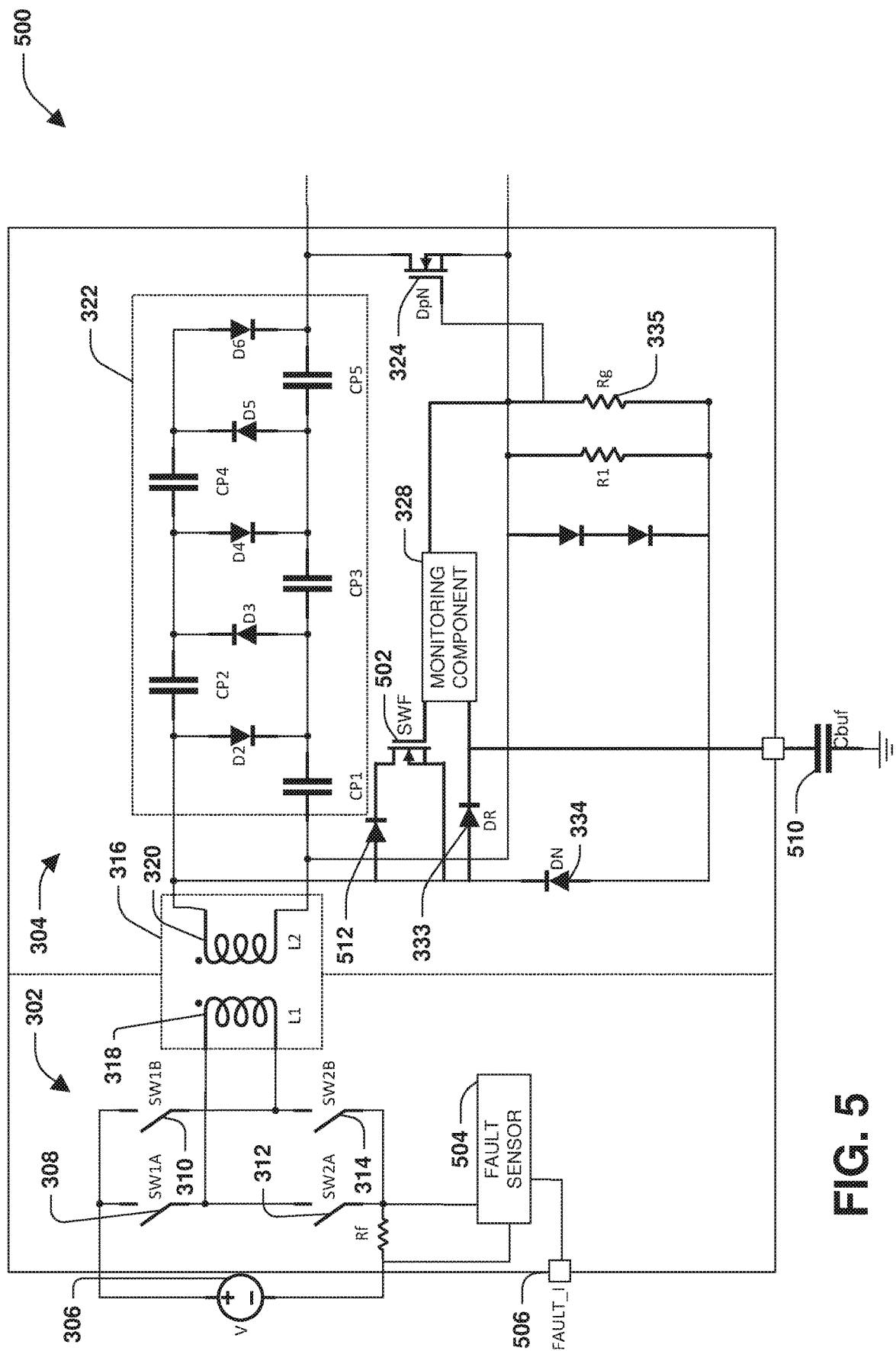
FIG. 5 is a component block diagram illustrating an apparatus for providing power transfer, direct gate drive, protection functions, and/or fault communication to a primary side across an isolation barrier in accordance with the techniques presented herein.

FIG. 5 illustrates an embodiment of an apparatus 500 for providing power transfer, direct gate drive, protection functions, and/or fault communication to a primary side across an isolation barrier. Apparatus 500 is similar to the apparatus 300 of FIG. 3, along with the addition of a reporting feature for fault communication to the primary side 302 and without the secondary side 304 comprising a driven switch (e.g., switch 326), sensing pins, and fault output. This is achieved with a single isolation transformer 316, which is also used for power transfer. When a countermeasure is implemented upon fault detection to switch off a controlled switch by means of the passive turn off device 324 (e.g., depletion NMOS DpN), sustaining the power transfer across the transformer 316 through the voltage multiplier is not actually necessary. Hence, a secondary winding of the transformer 316 may be short circuited through a switch SWF 502. This will cause an increase in current consumption at the primary side 302, which may be detected by a suitable threshold comparator in a fault sensor 504 so that the fault condition can be signaled at a dedicated pin 506. A diode 512 in series to the drain of the switch SWF 502 is used to ensure correct functioning in normal operation. If the diode 512 is absent, a body diode of the switch SWF 502 would short the secondary winding of the transformer 316 in the case that this is under negative bias. This may prevent correct functioning of the arrangement used for deactivating the passive turn off device 324 (e.g., depletion NMOS DpN where DN would not sufficiently pull down the gate of DpN).

In order to sustain the current consumption of the sensors of the monitoring component 328 and the arrangement which switches off the controlled switch while the secondary winding is shorted and unable deliver power, an external buffer capacitor CBUF 510 may be used. Alternatively, a buffer capacitor may also be integrated into the apparatus 500. This buffer capacitor is charged up to a sufficient voltage level, during normal operation while no fault is present or before activating the integrated safety monitoring sensors at the secondary side 304, before a fault transmission takes place. Additionally, a control pin, independent of the supply 306 of the primary side 302, may be used to control the push pull drive of the transformer 316 and thereby the activation of the switch driven at the secondary side 304.

In some embodiments, a transformer based isolation barrier for fault reporting to the primary side 302 may be implemented. In some embodiments, isolation capacitors may be used similarly to isolation transformers by coupling through the isolation capacitor's pulsed signals (e.g., carriers or modulated carriers). This can be detected/demodulated at the other side of the isolation, or by shorting the capacitor ends at the secondary side. In some embodiments, optical isolation barriers may be used for fault reporting to the primary side 302.

In some embodiments of implementing fault reporting from the secondary side 304 to the primary side 302, time multiplexing with the energy transfer from the primary side 302 to the secondary side 304 may be implemented. Also in this implementation a buffer capacitor may be utilized as an energy reservoir to keep the secondary side monitoring functions alive while the power transfer from primary to secondary side is interrupted. Time frames that are short enough for a voltage applied to the gate of the driven switch to not fall below a critical level may be implemented, and the energy transfer from the primary side 302 to the secondary side 304 can be interrupted. During the interruption, time pulses or carriers can be applied to the secondary winding and detected at the primary winding as an indication of a fault that happened at the secondary side 304. In some embodiments, a single isolation barrier (inductive or capacitive) may be used by means of time multiplexing.

Figure 6:
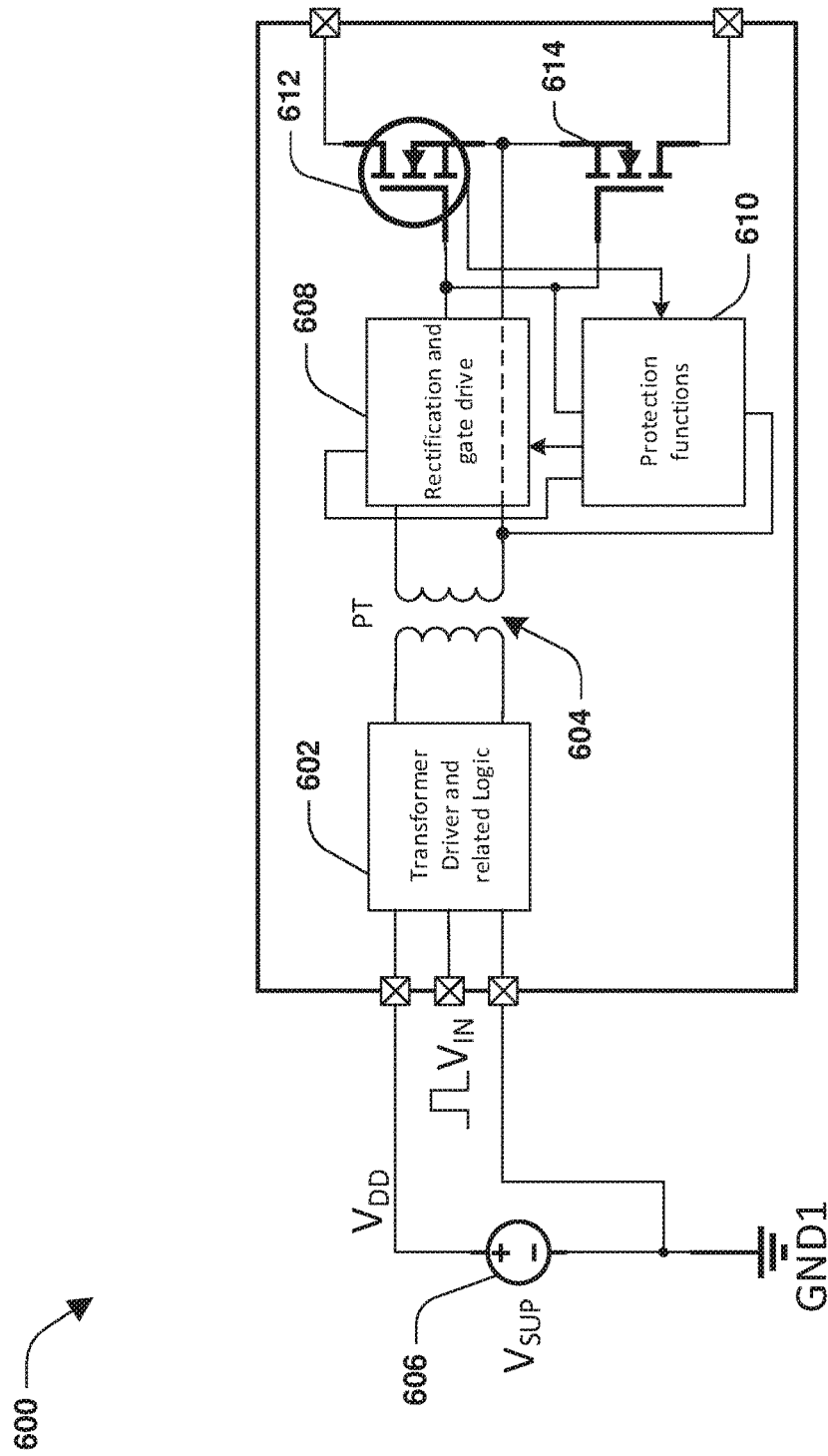
FIG. 6 is a component block diagram illustrating an apparatus for providing power transfer, direct gate drive, and/or protection functions across an isolation barrier in a solid state relay arrangement in accordance with the techniques presented herein.

FIG. 6 illustrates an embodiment of an apparatus 600 for providing power transfer, direct gate drive, protection functions. The apparatus 600 comprises a voltage supply 606, transformer driver and logic 602 used to control a transformer 604, a rectification and gate driver component 608 for driving a gate of a controlled switch 612, and protection functions 610 provided by a monitoring component. In some embodiments, the controlled switch 612 is chip or package integrated, and thus sensing of relevant parameters may be accomplished with functionality that is circuit or package integrated. For example, temperature, voltage, or current monitoring may be performed on chip or in package by means of integrated structures implementing the protection functions 610, instead of relying on external components.

In some embodiments, the controlled switch 612 is integrated together with the protection functions 610 in a solid state relay arrangement. In some embodiments, an arrangement of 2 driven switches is illustrated (e.g., controlled switch 612 and controlled switch 614) in order to implement a bidirectional controlled switch. This arrangement is suitable for switching AC signals.

Figure 7:
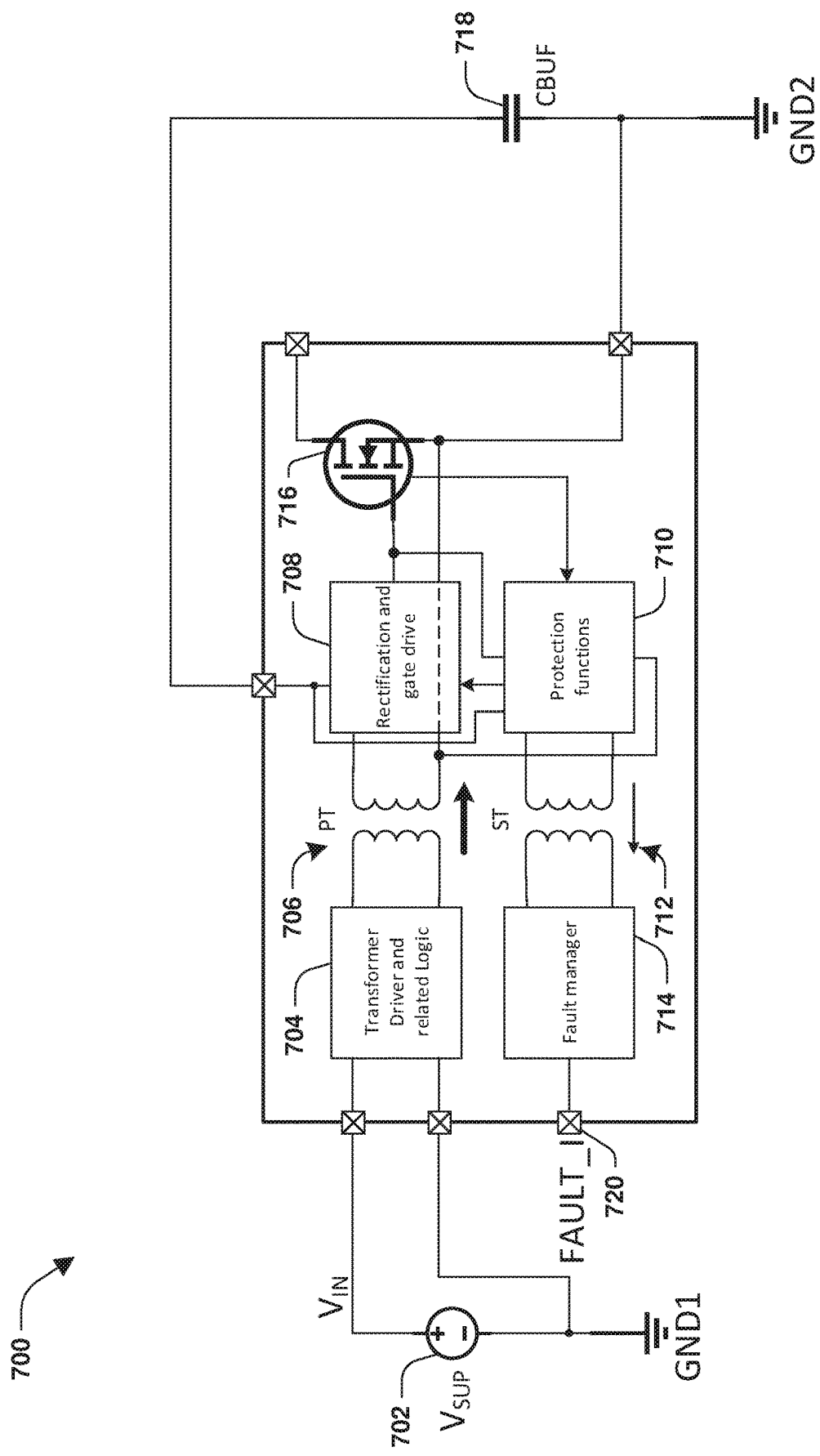
FIG. 7 is a component block diagram illustrating an apparatus for providing power transfer, direct gate drive, protection functions, and/or fault communication to a primary side across an isolation barrier in a solid state relay arrangement in accordance with the techniques presented herein.

FIG. 7 illustrates an embodiment of an apparatus 700 for providing power transfer, direct gate drive, protection functions, and/or fault communication to a primary side across an isolation barrier. The apparatus 700 comprises a voltage supply 702, transformer driver and logic 704 used to control a first transformer 706, a rectification and gate driver component 708 for driving a gate of a controlled switch 716, a buffer capacitor CBUF 718, protection functions 710 provided by a monitoring component, a fault manager 714, and a second transformer 712 through which fault detection signals are transmitted from the protection functions 710 to the fault manager 714 used to output the fault detection signals through a fault output pin 720.

In some embodiments, the apparatus 700 is configured according to a solid state relay arrangement that has an integration of the controlled switch 716 together with the protection functions 710, fault communication to a primary side, and signaling at the primary side according to the solid state relay arrangement. The first transformer 706 is used for power transfer from the primary side to the secondary side while a second transformer 712 is used for fault signal transfer from the secondary side to the primary side.

Figure 8:
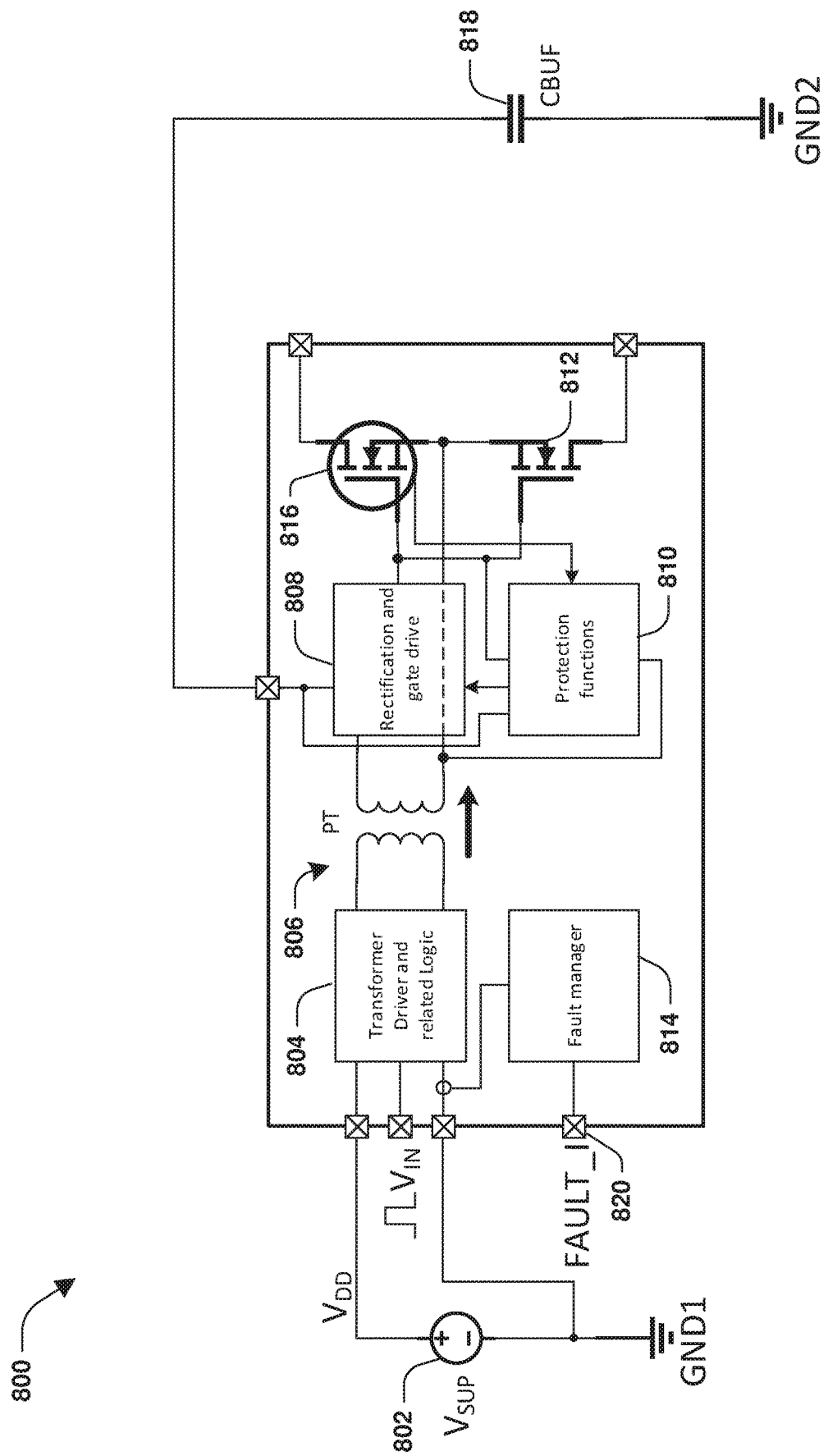
FIG. 8 is a component block diagram illustrating an apparatus for providing power transfer, direct gate drive, protection functions, and fault communication to a primary side across an isolation barrier in a solid state relay arrangement in accordance with the techniques presented herein.

FIG. 8 illustrates an embodiment of an apparatus 800 for providing power transfer, direct gate drive, protection functions, and/or fault communication to a primary side across an isolation barrier. The apparatus 800 comprises a voltage supply 802, transformer driver and logic 804 used to control a transformer 806, a rectification and gate driver component 808 for driving a gate of a first controlled switch 816, a buffer capacitor CBUF 818, protection functions 810 provided by a monitoring component, a fault manager 814, and a fault output pin 820.

In some embodiments, the apparatus 800 is configured according a solid state relay arrangement that has a controlled bidirectional power switch (e.g., the first controlled switch 816 and a second controlled switch 812) together with the protection functions 810, fault communication to the primary side, and signaling at the primary side according to the solid state relay arrangement. A single transformer 806 is used for power transfer from the primary side to the secondary side. The single transform is also used for fault signaling by shorting a transformer secondary winding and detecting a current consumption increase at the primary side as a signal that a fault occurred.

Figure 9:
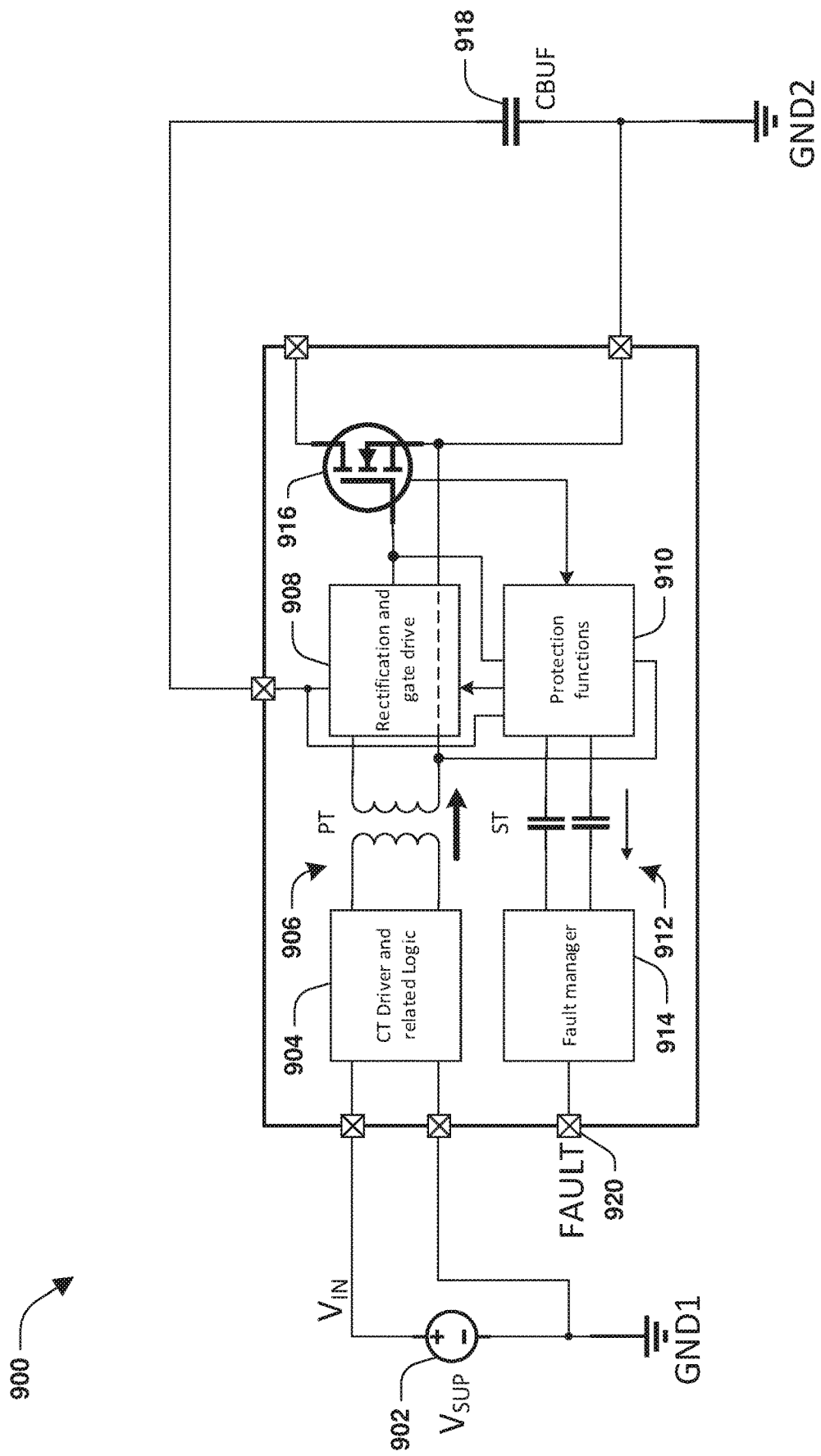
FIG. 9 is a component block diagram illustrating an apparatus for providing power transfer, direct gate drive, protection functions, and/or fault communication to a primary side across an isolation barrier in a solid state relay arrangement in accordance with the techniques presented herein.

FIG. 9 illustrates an embodiment of an apparatus 900 for providing power transfer, direct gate drive, protection functions, and/or fault communication to a primary side across an isolation barrier. The apparatus 900 comprises a voltage supply 902, CT driver and logic 904, a transformer 906, a rectification and gate driver component 908 for driving a gate of a controlled switch 916, a buffer capacitors 918, protection functions 910 provided by a monitoring component, a fault manager 914, a fault output pin 920, and a capacitive isolation barrier 912.

In some embodiments, the apparatus 900 is configured according a solid state relay arrangement that has an integration of the controlled switch 916 together with the protection functions 910, fault communication to the primary side, and signaling at the primary side accordingly to a solid state relay arrangement. The transformer 906 is used for power transfer from the primary side to the secondary side while the capacitive isolation barrier 912 is used for fault signal transfer from the secondary side to the primary side. In some embodiments, isolation capacitors may be used similarly to isolation transformers by coupling the isolation capacitors through pulsed signals (e.g., carriers or modulated carriers), which can be detected/demodulated at the other side of the isolation.

Figure 10:
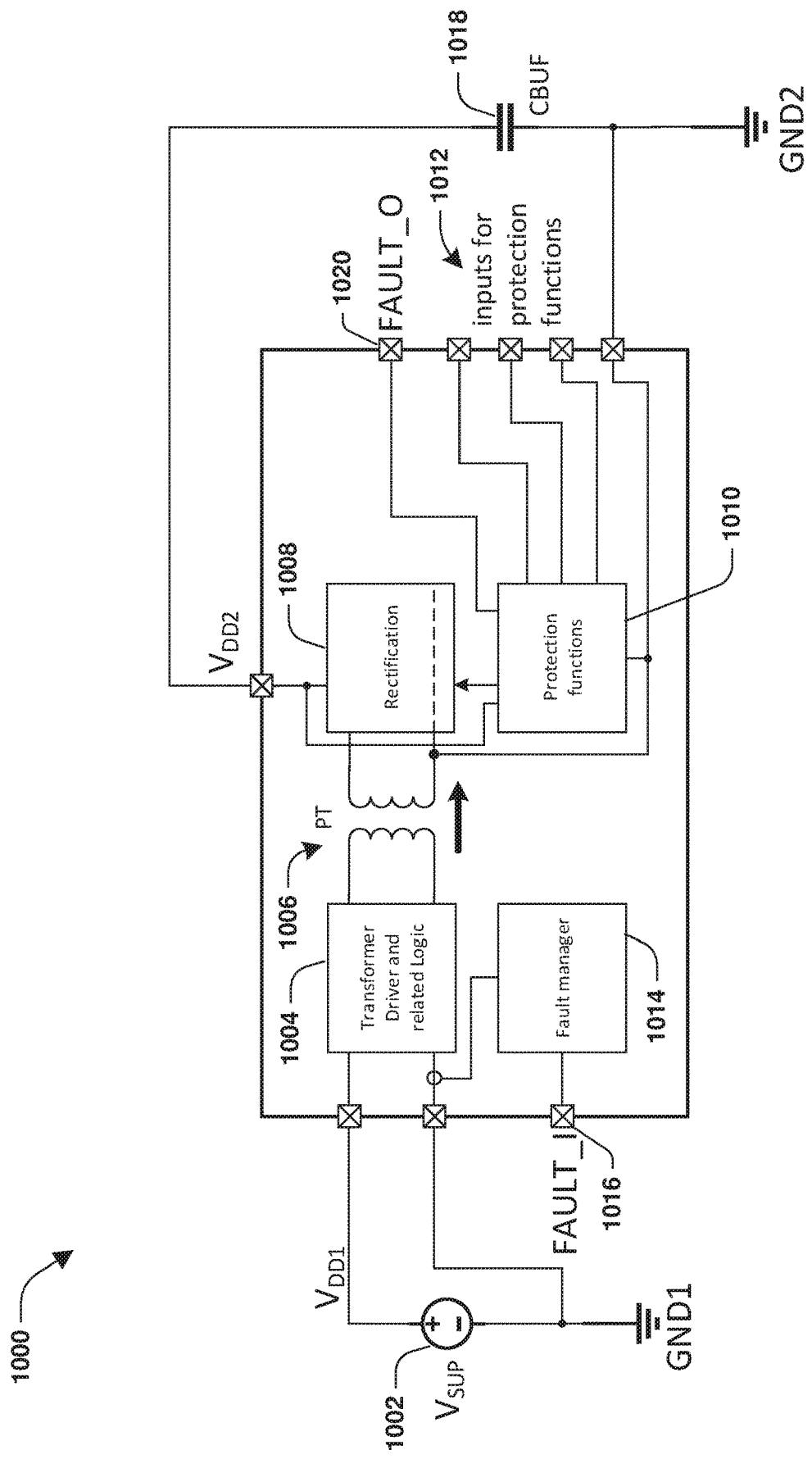
FIG. 10 is a component block diagram illustrating an apparatus for providing power transfer, protection functions, and/or fault communication across an isolation barrier using a single transformer in accordance with the techniques presented herein.

FIG. 10 illustrates an embodiment of an apparatus 1000 for providing power transfer, protection functions, and/or fault communication to a primary side across an isolation barrier. The apparatus 1000 comprises a voltage supply 1002, transformer driver and logic 1004, a transformer 1006, a rectification component 1008, protection functions 1010 provided by a monitoring component, a fault manager 1014, a primary side fault output pin 1016, a secondary side fault output pin 1020, inputs 1012 for the protection functions 1010, and a buffer capacitor CBUF 1018.

In some embodiments, the apparatus 1000 is configuration with of an isolated safety monitor. A single transformer 1006 is used for power transfer from a primary side to a secondary side. Shorting a transformer secondary winding and detecting a current consumption increase at the primary side as a signal that a fault occurred. In some embodiments, a second transformer, not illustrated, may be implemented for fault signal transfers.

Figure 11:
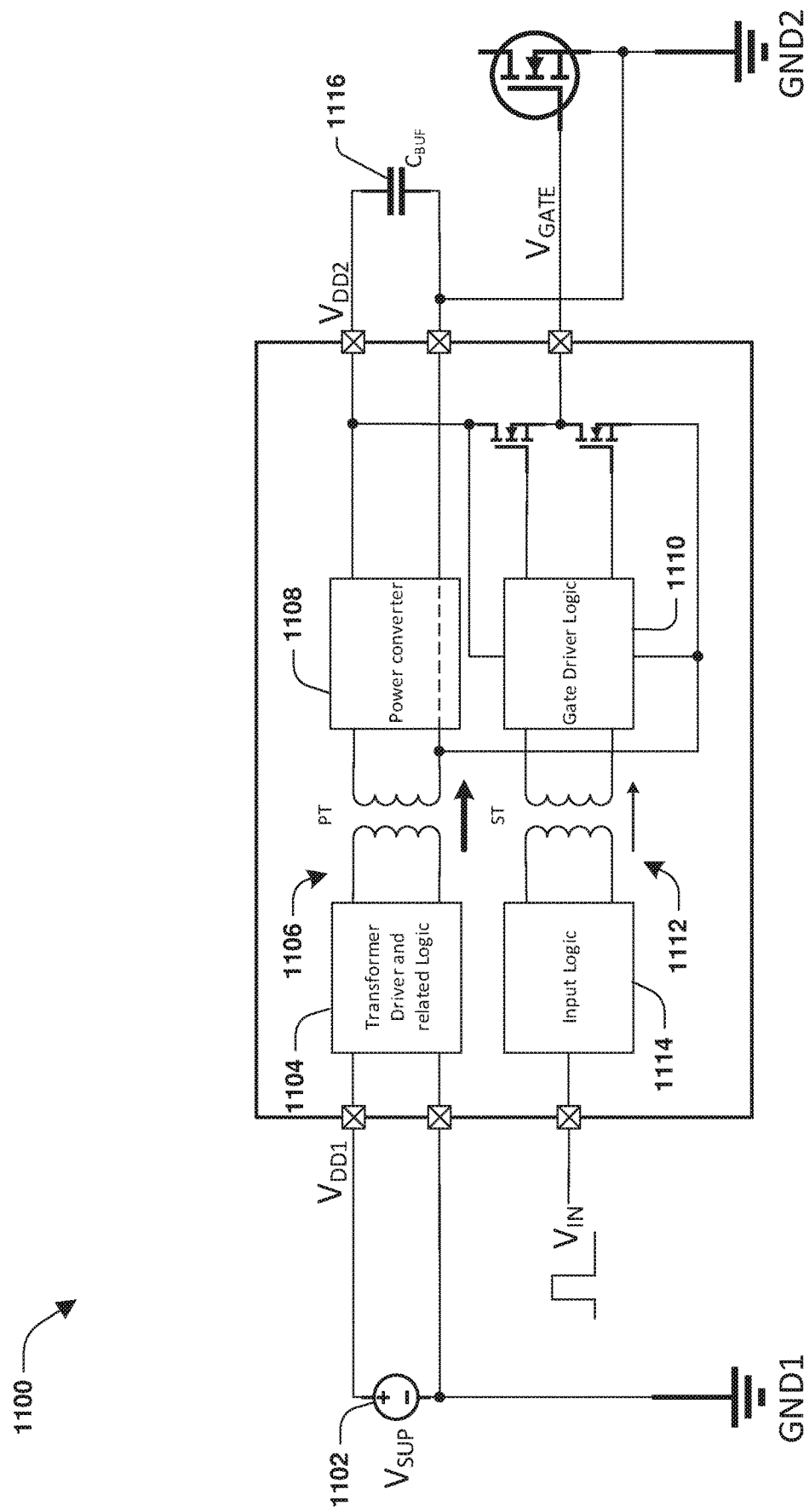
FIG. 11 is a component block diagram illustrating an apparatus for providing power transfer, indirect gate drive.

FIG. 11 illustrates an embodiment of an apparatus 1100 for providing power transfer, indirect gate drive, and/or protection functions. In some embodiments, the apparatus 1100 is configured with an integration of an isolated gate driver with an isolated transformer based power converter 1108. This provides an output-to-input voltage conversion ratio larger than 1 so that the voltage generated for supplying the secondary side is higher than the voltage at the primary side. In some embodiments, the apparatus 1100 may be configured with a flyback converter, a single phase flyback converter, a flyback converter with 2 interleaved phases, a resonant converter (e.g., LLC, LCC, etc.), etc. With power transfer to a secondary domain of the apparatus 1100 (the secondary side) and a sufficient power conversion efficiency, the generated secondary power supply can be used to supply an isolated gate driver and its related ancillary functions such as ancillary protection functions.

The apparatus 1100 comprises a voltage supply 1102, transformer driver and logic 1104, a first transformer 1106, a power converter 1108, gate driver logic 1110 of an isolated gate driver, a secondary transformer 1112, input logic 1114, a buffer capacitor CBUF 1116, and/or other components. In some embodiments, the apparatus 1100 is configured with an integration of a transformer based isolated power converter together with an isolated gate driver associated with the isolated gate driver logica 1110. The power converter topology is configured such that a voltage difference VDD2-VGND2 is substantially larger than VDD1-VGND1. The integrated power converter and the arrangement with isolated gate driver may utilize an external energy tank or filter, represented by the buffer capacitor CBUF 1116. The second transformer 1112 is part of the isolated gate driver associated with isolated gate driver logic 1110. In some embodiments, the second transformer 1112 may be exchanged with a capacitive or optical isolation barrier. In some embodiments, the apparatus 1100 comprises dedicated pins for gate driver ancillary functions.

In some embodiments, the isolated gate driver may also offer fault signaling at the primary side. This can be achieved by adding an isolation barrier (transformer, capacitive, or optical based) to carry out the fault communication from the secondary side to the primary side. Alternatively, a single galvanic isolation barrier may be used in the isolated gate driver implementation, which supports bidirectional communication (e.g. through time multiplexed primary or secondary transformer winding drive) for gate drive control signals from the primary side to the secondary side and for fault reporting signals from the secondary side to the primary side. This is generally beneficial in terms of integrated silicon die area, which is illustrated in FIG. 12.

Figure 12:
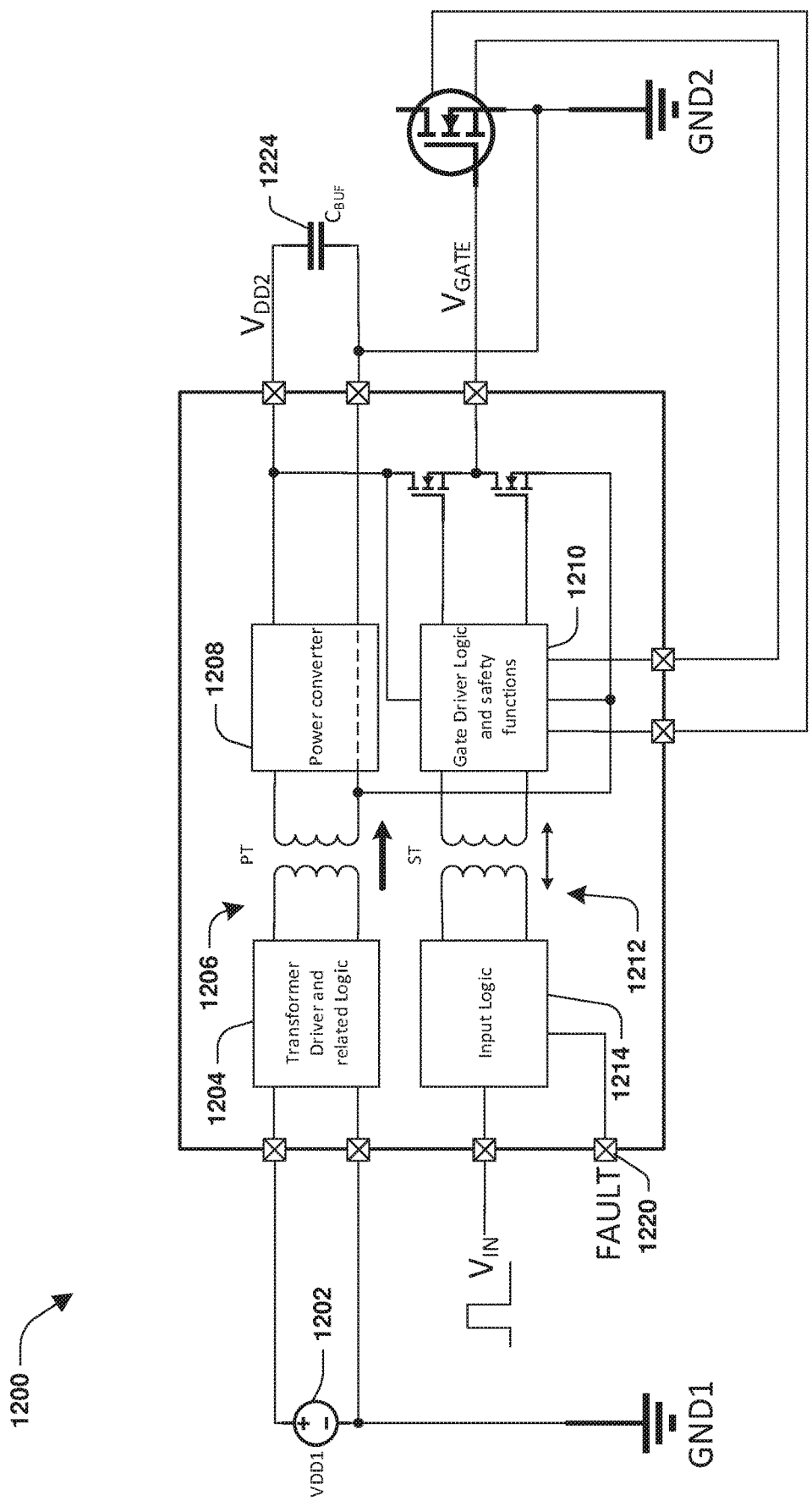
FIG. 12 is a component block diagram illustrating an apparatus for providing power transfer, indirect gate drive, protection functions, and/or fault communication in accordance with the techniques presented herein.

FIG. 12 illustrates an embodiment of an apparatus 1200 for providing power transfer, direct gate drive, protection functions, and/or fault communication to a primary side across an isolation barrier. In some embodiments, the apparatus 1200 is configured with an integration of an isolated gate driver with an isolated transformer based power converter 1208, which provides an output-to-input voltage conversion ratio larger than 1 so that the voltage generated to supply the secondary side is higher than the voltage at the primary side. The apparatus 1200 comprises a voltage supply 1202, transformer driver and logic 1204, a first transformer 1206, a power converter 1208, gate driver logic and safety functions 1210, a second transformer 1212, input logic 1214, a buffer capacitor CBUF 1224, a fault output pin 1220, and/or other components.

In some embodiments, the apparatus 1200 is configured with an integration of a transformer based isolated power converter together with an isolated gate driver associated with the isolated gate driver logic and safety functions 1210. The power converter topology is configured such that the voltage difference VDD2-VGND2 is substantially larger than VDD1-VGND1. The second transformer 1212 is part of an isolated gate driver associated with isolated gate driver logic and safety functions 1210. In this case, a single galvanic isolation barrier is used for bidirectional communication in the isolated gate driver. In some embodiments, the apparatus 1200 comprises dedicated pins for gate driver ancillary functions. The isolated gate driver logic and safety functions 1210 may implement a safety monitoring and/or related countermeasures feature. In some embodiments, the apparatus 1200 may implement a reporting feature and/or an integrated power driven switch feature, which may be implemented with the integration of single or bidirectional electronic switches.

An embodiment of the presently disclosed techniques comprises an apparatus. The apparatus comprises an energy transfer device configured to supply power from a primary side of an isolation barrier through the isolation barrier to a secondary side of the of the isolation barrier to directly drive a gate of a switch for controlling output of the switch at the secondary side; and a monitoring component configured to: monitor an operating state of the switch; and evaluate the operating state to determine whether a fault has occurred.

According to some embodiments, the monitoring component is configured to implement a countermeasure in response to the operating state indicating the fault.

According to some embodiments, the monitoring component is configured to implement the countermeasure to turn off the switch, and wherein a pulldown device at the secondary side is activated to turn off the switch.

According to some embodiments, the isolation barrier comprises a transformer, and wherein the monitoring component is powered from energy from a secondary side of the transformer.

According to some embodiments, the monitoring component is configured to transmit a signal to the primary side to indicate that the fault was detected.

According to some embodiments, the monitoring component is configured to transmit a signal to the primary side to indicate that the countermeasure was implemented.

According to some embodiments, the switch and the apparatus are arranged in a multi-die package.

According to some embodiments, the monitoring device is integrated into the secondary side of the apparatus.

According to some embodiments, the apparatus comprises a fault manager located at the primary side, wherein the fault manager is configured to implement an action in response to receiving a signal from the monitoring component that the fault was detected.

According to some embodiments, the monitoring component is configured to send a signal regarding the operating state to the primary side through the insolation barrier by shorting a secondary side of the isolation barrier, wherein the signal is detected at the primary side as an increase in current consumption.

According to some embodiments, the monitoring component is configured to send a signal regarding the operating state through a second isolation barrier.

According to some embodiments, the apparatus comprises a fault manager located at the primary side, wherein the fault manager is configured to: suspend the supply of the power to the secondary side for a time duration; and receive a signal during the time duration through the isolation barrier from the monitoring component, wherein the signal is derived from the operating state of the switch.

An embodiment of the presently disclosed techniques comprises an apparatus. The apparatus comprises an energy transfer device configured to supply power from a primary side of an isolation barrier through the isolation barrier to a secondary side of the of the isolation barrier to power an isolated gate driver to drive a gate of a switch for controlling output of the switch at the secondary side; and a monitoring component configured to: monitor an operating state of the switch; and evaluate the operating state to determine whether a fault has occurred.

According to some embodiments, the apparatus comprises an isolated power converter configured to provide a voltage conversion ratio larger than 1 for driving the gate of the switch.

According to some embodiments, the monitoring component is configured to implement a countermeasure in response to the operating state indicating the fault.

According to some embodiments, the monitoring component is configured to transmit a signal to the primary side to indicate that at least one of the fault was detected or a countermeasure was implemented in response to the fault.

According to some embodiments, the switch is integrated into the secondary side of the apparatus.

An embodiment of the presently disclosed techniques comprises a method. The method comprises controlling a monitoring component of an isolated power converter to determine an operating state of a switching component associated with a secondary side of an apparatus, wherein the switching component is driven based upon power transferred from a primary side of the apparatus through an isolation barrier to the secondary side; evaluating the operating state to determine whether the switching component has experienced a fault; and in response to the switching component experiencing the fault, implementing a countermeasure.

According to some embodiments, the method comprises transmitting a signal to the primary side to indicate that at least one of the faults was detected or the countermeasure was implemented.

According to some embodiments, the method comprises suspending the transfer of the power to the secondary side for a time duration; and receiving a signal during the time duration through the isolation barrier from the monitoring component, wherein the signal corresponds to the operating state of the switching component.

An embodiment of the presently disclosed techniques comprises an apparatus, comprising a means for controlling a monitoring component of an isolated power converter to determine an operating state of a switching component associated with a secondary side of an apparatus, wherein the switching component is driven based upon power transferred from a primary side of the apparatus through an isolation barrier to the secondary side; a means for evaluating the operating state to determine whether the switching component has experienced a fault; and a means for implementing a countermeasure in response to the switching component experiencing the fault.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
   an energy transfer device configured to supply power from a primary side of an isolation barrier through the isolation barrier to a secondary side of the isolation barrier to directly drive a gate of a switch for controlling output of the switch at the secondary side;
   one or more pulldown devices configured to passively deactivate the switch when no power transfer is being performed by the energy transfer device to drive the gate of the switch;
   a charge pump configured to disable the one or more pulldown devices from passively deactivating the switch when the power transfer is being performed, and wherein a load at the charge pump enables the one or more pulldown devices to passively deactivate the switch when the power transfer is not being performed; and
   a monitoring component configured to:
      monitor an operating state of the switch;
      evaluate the operating state to determine whether a fault has occurred; and
      in response to the operating state indicating the fault, implement a countermeasure to turn off the switch, and wherein the one or more pulldown devices at the secondary side is activated to turn off the switch as part of the countermeasure.

2. The apparatus of claim 1, wherein a source and a gate of the one or more pulldown devices are at a same potential and create a conduction channel between the source and a drain of the one or more pulldown devices when no energy transfer is being performed by the energy transfer device.

3. The apparatus of claim 2, wherein the conduction channel applies a turn off strength between the gate and a source of the switch to turn off the switch by shorting the gate to the source of the switch.

4. The apparatus of claim 1, wherein the isolation barrier comprises a transformer, and wherein the monitoring component is powered from energy from the secondary side of the transformer.

5. The apparatus of claim 1, wherein the monitoring component is configured to:
   transmit a signal to the primary side to indicate that the fault was detected.

6. The apparatus of claim 1, wherein the monitoring component is configured to:
   transmit a signal to the primary side to indicate that the countermeasure was implemented.

7. The apparatus of claim 1, wherein the switch and the apparatus are arranged in a multi-die package.

8. The apparatus of claim 1, wherein the monitoring component is integrated into the secondary side of the apparatus.

9. The apparatus of claim 1, comprising:
   a fault manager located at the primary side, wherein the fault manager is configured to implement an action in response to receiving a signal from the monitoring component that the fault was detected.

10. The apparatus of claim 1, wherein the monitoring component is configured to send a signal regarding the operating state to the primary side through the isolation barrier by shorting the secondary side of the isolation barrier, wherein the signal is detected at the primary side as an increase in current consumption.

11. The apparatus of claim 1, wherein the monitoring component is configured to send a signal regarding the operating state through a second isolation barrier.

12. The apparatus of claim 1, comprising:
    a fault manager located at the primary side, wherein the fault manager is configured to:
       suspend the supply of the power to the secondary side for a time duration; and
       receive a signal during the time duration through the isolation barrier from the monitoring component, wherein the signal is derived from the operating state of the switch.

13. An apparatus, comprising:
    an energy transfer device configured to supply power from a primary side of an isolation barrier through the isolation barrier to a secondary side of the of the isolation barrier to power an isolated gate driver to drive a gate of a switch for controlling output of the switch at the secondary side;
    one or more pulldown devices configured to passively deactivate the switch when no power transfer is being performed by the energy transfer device to drive the gate of the switch;
    a charge pump configured to disable the one or more pulldown devices from passively deactivating the switch when the power transfer is being performed, and wherein a load at the charge pump enables the one or more pulldown devices to passively deactivate the switch when the power transfer is not being performed; and
    a monitoring component configured to:
       monitor an operating state of the switch;
       evaluate the operating state to determine whether a fault has occurred; and
       in response to the operating state indicating the fault, implement a countermeasure to turn off the switch, and wherein the one or more pulldown devices at the secondary side is activated to turn off the switch as part of the countermeasure.

14. The apparatus of claim 13, comprising:
    an isolated power converter configured to provide a voltage conversion ratio larger than 1 for driving the gate of the switch.

15. The apparatus of claim 13, wherein a source and a gate of the one or more pulldown devices are at a same potential and create a conduction channel between the source and a drain of the one or more pulldown devices when no energy transfer is being performed by the energy transfer device.

16. The apparatus of claim 13, wherein the monitoring component is configured to:
transmit a signal to the primary side to indicate that the fault was detected.

17. The apparatus of claim 13, wherein the switch is integrated into the secondary side of the apparatus.

18. A method comprising:
controlling a monitoring component of an isolated power converter to determine an operating state of a switching component associated with a secondary side of an apparatus, wherein the switching component is driven based upon power transferred from a primary side of the apparatus through an isolation barrier to the secondary side;
passively deactivating, by one or more pulldown devices at the secondary side, the switching component when there is no power transfer is being performed to drive the switching component;
disabling, by a charge pump, the one or more pulldown devices from passively deactivating the switch when the power transfer is being performed, and wherein thein a load at the charge pump enables the one or more pulldown devices to passively deactivate the switch when the power transfer is not being performed
evaluating the operating state to determine whether the switching component has experienced a fault; and
in response to the switching component experiencing the fault, implementing a countermeasure by activating the one or more pulldown devices to turn off the switching component.

19. The method of claim 18, comprising:
transmitting a signal to the primary side to indicate that the faults was detected.

20. The method of claim 18, comprising:
suspending the transfer of the power to the secondary side for a time duration; and
receiving a signal during the time duration through the isolation barrier from the monitoring component, wherein the signal corresponds to the operating state of the switching component.

* * * * *